United States Patent [19]
Scott

[11] 3,988,727
[45] Oct. 26, 1976

[54] TIMED SWITCHING CIRCUIT

[75] Inventor: Charles E. Scott, Indianapolis, Ind.

[73] Assignee: P. R. Mallory & Co., Inc., Indianapolis, Ind.

[22] Filed: June 24, 1974

[21] Appl. No.: 482,650

[52] U.S. Cl............................ 340/309.1; 340/309.4
[51] Int. Cl.².......................................... G08B 7/00
[58] Field of Search............ 307/141, 141.4, 252 F, 307/293; 340/309.1

[56] References Cited
UNITED STATES PATENTS

| | | | |
|---|---|---|---|
| 3,553,483 | 1/1971 | Jarvis | 307/141 R |
| 3,651,371 | 3/1972 | Tingley | 307/141 X |
| 3,663,830 | 5/1972 | Miller | 307/141 R |
| 3,790,815 | 2/1974 | Karklys | 307/141 R |

Primary Examiner—Harold I. Pitts
Attorney, Agent, or Firm—Hoffmann, Meyer & Hanson

[57] ABSTRACT

A timed switching circuit includes timer means for timing an event, timer means for timing the length of an alarm signal, and timer means for timing delays prior to and immediately after an event is timed. The circuit also includes an appliance control/indicator means for controlling an appliance in response to a timed event and indicating the operational state thereof.

8 Claims, 2 Drawing Figures

TIMED SWITCHING CIRCUIT

SUMMARY OF THE INVENTION

Generally speaking, the present invention relates to a timed switching circuit that includes an alarm timer means providing an audible alarm at predetermined intervals, a function timer means connected to the alarm timer means, for providing an operational sequence at predetermined time intervals, a delay timer means connected to the function timer means, for providing time delays before and after the function timer means starts timing an operational sequence, a snubber means connected to the delay timer means for preventing the solid-state switching means from turning on momentarily at the beginning of a timed cycle, an appliance control/indicator means for controlling a function of an appliance and indicating the state of operation of the appliance, and an alternating current power supply connected to the timed switching circuit.

The controls and timing mechanisms of many appliances are becoming more and more complex as new features are added. One particular appliance, a microwave oven, requires a number of timing and control functions. These functions have, for the most part, been accomplished by cam-actuated electomechanical timer switches. The present invention, utilizing solid-state timing to accomplish the same functions, provides improved reliability, diminished costs, and greater versatility in a timer control for a microwave oven.

Accordingly, it is a feature of the present invention to provide a timed switching circuit that times an event, at the end of which an audible alarm sounds. Another feature of the present invention is to provide a timed switching circuit that times an event, at the end of which a set of electrical contacts is actuated. Another feature of the present invention is to provide a timed switching circuit that times a cooking event in a microwave oven. Another feature of the present invention is to provide a timed switching circuit that produces a time delay prior to the timing of an event and a timed delay succeeding the timing of an event. Yet another feature of the present invention is to provide a timed switching circuit that produces a delay in application of high voltage to a magnetron tube in a microwave oven until the magnetron filaments heat up. Still another feature of the present invention is to provide a timed switching circuit that produces a delay in removing current to a magnetron filament after a cooking function in a microwave oven has finished. Yet another feature of the present invention is to provide a timed switching circuit that includes a switching means, patch cords, and a series combination of resistors for varying the lengths of time available for timing a function. Still another feature of the present invention is to provide a timed switching circuit that includes a plurality of interrelated and interconnected timing, switching, and indicating functions for a microwave oven. These and other features will become more apparent from the following specification taken in conjunction with the accompanying drawings.

BRIEF DESCRIPTION OF THE DRAWINGS

FIG. 1b is the other half of the timed switching circuit of FIG. 1a.

DETAILED DESCRIPTION

Figure 1A:
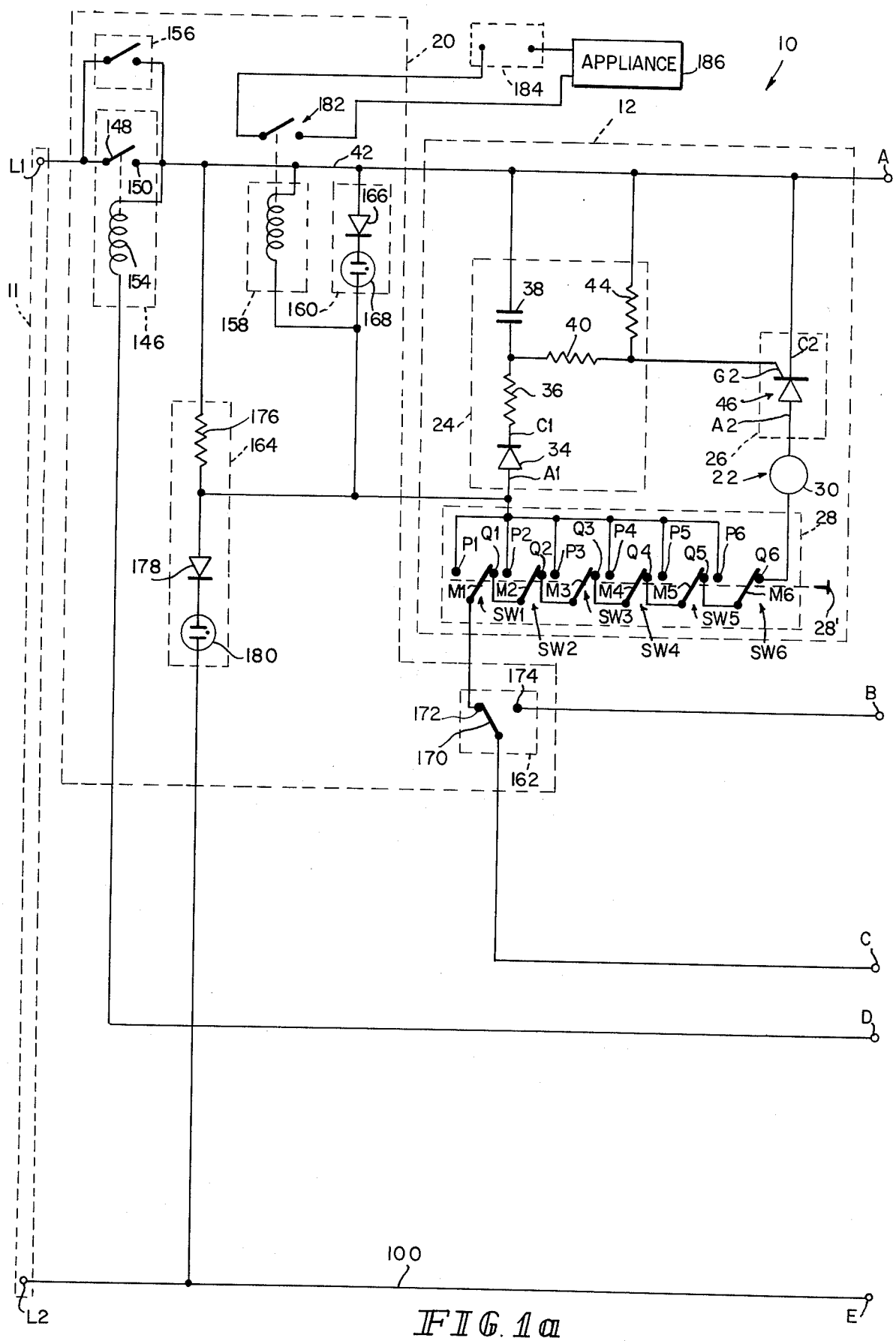
FIG. 1a is one half a timed switching circuit.
Figure 1B:
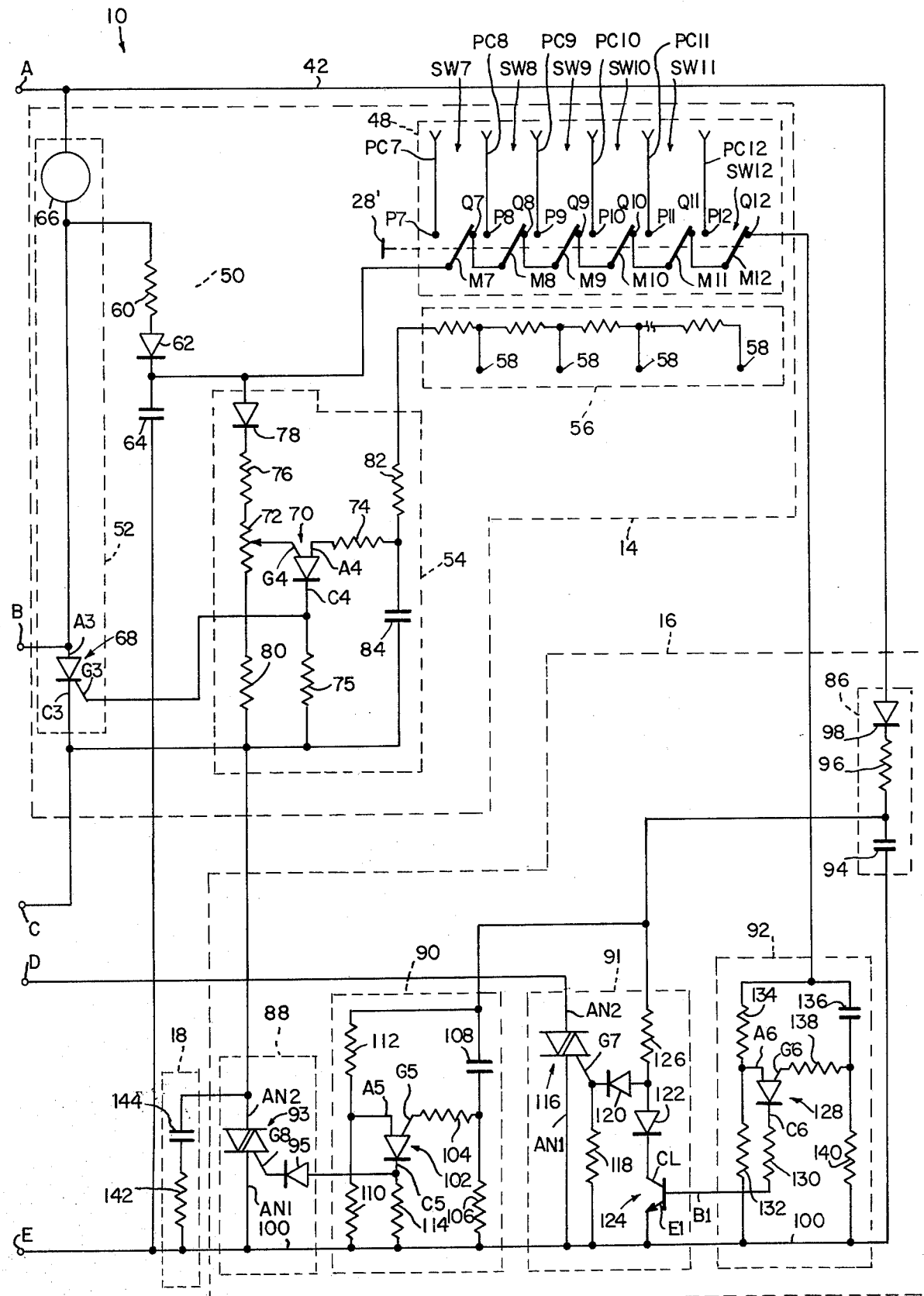

Referring now to FIGS. 1a and 1b, a timed-switching circuit 10 is comprises essentially of an alarm timer means 12, a function timer means 14, a delay timer means 16, a snubber means 18, an appliance control indicator means 20. The appropriate connections of the two portions of circuit 10 shown in FIGS. 1a and 1b are designated with the letters A, B, C, D and E in each figure. Circuit 10 is connected to an appropriate AC power supply 11 shown in FIG. 1.

Alarm timer means 12 generally comprises an audible alarm 22, a first timing means 24, an alarm turn-on means 26, and a relay/alarm switching means 28. Audible alarm 22 comprises an electromechanical buzzer 30, and relay/alarm switching means 28 comprises a multi-pole push button switch shown as six ganged single-pole double-throw switches SW1, SW2, SW3, SW4, SW5, and SW6 in the illustrated embodiment.

First timing means 24 includes a diode 34, an anode A1 of which is connected to relay/alarm switching means 28. A resistor 36 is connected between a cathode C1 of diode 34 and a capacitor 38, and the other end of capacitor 38 is connected to a first side 42 of circuit 10. A resistor 40 is connected between the junction of resistor 36 and capacitor 38 and alarm turn-on means 26. And, another resistor 44 is connected between first side 42 of circuit 10 and resistor 40.

Alarm turn-on means 26 comprises a silicon-controlled rectifier 46, and anode A2 of which is connected to buzzer 30, a gate G2 of which is connected to resistors 40 and 44 of first timing means 24, and a cathode C2 of which is connected to first side 42 of circuit 10.

Switches SW1-SW6 include respectively normally-open stationary contacts P1, P2, P3, P4, P5, and P6 as shown in FIG. 1 all connected together and to anode A1 of diode 34. Switches SW1-SW6 also include respectively normally-closed stationary contacts Q1, Q2, Q3, Q4, Q5, and Q6 and movable contacts M1, M2, M3, M4, M5, and M6. Contact M1 is connected to appliance control/indicator means 20. Contact Q1 is connected to contact M2. Contact Q2 is connected to contact M3. Contact Q3 is connected to contact M4. Contact Q4 is connected to contact M5. Contact Q5 is connected to contact M6. And, contact Q6 is connected to audible alarm 22.

Function timer means 14, illustrated in FIG. 4, generally comprises an electrical switching means 48, a low current power supply 50, a switch reset means 52, a second timing means 54, and a series combination of timing resistors 56.

Electrical switching means 48 comprises six ganged single-pole double-throw switches SW7, SW8, SW9, SW10, SW11, and SW12. Switches SW7-SW12 include, respectively, normally open stationary contacts P7, P8, P9, P10, P11, and P12 as shown in FIG. 2. Switches SW7-SW12 also include, respectively, normally closed stationary contacts Q7, Q8, Q9, Q10, Q11, and Q12. Additionally, switches SW7-SW12 include, respectively, movable contacts M7, M8, M9, M10, M11, and M12. Contacts P7-P12 are respectively connected to patch cords PC7, PC8, PC9, PC10, PC11, and PC12. Contact M7 is connected to second timing means 54 and power supply 50. Contact Q7 is connected to contact M8. Contact Q8 is connected to contact M9. Contact Q9 is connected to contact M10. Contact Q10 is connected to contact M11. Contact Q11 is connected to contact M12. And, contact Q12 is connected to delay timer means 16.

Function timer means 14 includes a series combination of timing resistors 56. One end of the combination is connected to second timing means 54, and the other end is not directly connected to anything. In between each resistor of series combination 56, is a termination 58. Each termination is capable of receiving and making an electrical connection with, one of patch cords PC7-PC12.

In one embodiment of the present invention as illustrated in FIGS. 1a and 1b, single-pole double-throw switches SW1-SW6 can be combined with single-pole double-throw switches SW7-SW12 so that these pairings are made: SW1 with SW7, SW2 with SW8, SW3 with SW9, SW4 with SW10, SW5 with SW11, and SW6 with SW12. Each pairing, such as SW1 with SW7, then comprises a double-pole double-throw switch. And, circuit 10 functions exactly the same as it does with the separate single-pole double-throw switches with this difference: When SW1 is switched, SW7 also switches, and the same applies to the remaining pairs of switches. For convenience of explanation of the functions of circuit 10, the switches SW1-SW12 are shown in the two separate groups, 28 and 48, in FIGS. 1 and 2.

As was stated previously, function timer means 14 includes a low current power supply 50. This power supply includes a series combination of a resistor 60, a diode 62 and a capacitor 64. Resistor 60 is connected to switch reset means 52, and the junction between diode 62 and capacitor 64 is connected to second timing means 54 and switching means 48.

Switch reset means 52 includes a solenoid 66 and a silicon-controlled rectifier (SCR) 68. One side of solenoid 66 is connected to first side 42 of circuit 10, and another side is connected to low current power supply 50 and to an anode A3 of SCR 68. Anode A3 is also connected to appliance control/indicator means 20. A gate G3 of SCR 68 is connected to second timing means 54, and a cathode C3 of SCR 68 is connected to appliance control/indicator means 20 and to second timing means 54. Solenoid 66 is mechanically connected to a switch latching bar 28' and the bar is connected to switches SW1-SW12.

Second timing means 54 includes a programmable unijunction transistor 70, a gate G4 of which is connected to a variable resistor 72, an anode A4 of which is connected to one side of a resistor 74, and a cathode C4, of which is connected to one side of a resistor 75 and to gate G3 of SCR 68. Variable resistor 72 is connected through another resistor 76 and a diode 78 to the junction between capacitor 64 and diode 62 of low current power supply 50. Variable resistor 72 is also connected through a resistor 80 to cathode C3 of SCR 68, to appliance control/indicator means 20, and to delay timer means 16. Resistor 74 is connected to a junction of a resistor 82 and a capacitor 84, wherein resistor 82 is connected to series combination of resistors 56, and capacitor 84 is connected to resistors 75 and 80, cathode C3, and appliance control/indicator means 20, and delay timer means 16.

Delay timer means 16 generally comprises a power supply means 86, a power turn-on means 88, an on-delay timer means 90, a power turn-off means 91, and an off-delay timer means 92. Power supply means 86 comprises a series combination of a capacitor 94, a resistor 96, and a diode 98. Capacitor 94 is connected between resistor 96 and a second side 100 of circuit 10.

Diode 98 is connected between resistor 96 and first side 42 of circuit 10.

On-delay timer means 90 includes a programmable unijunction transistor (PUT) 102, a gate G5 of which is connected through a resistor 104 to a junction between another resistor 106 and a capacitor 108. An anode A5 of PUT 102 is connected to the junction of two more resistors 110 and 112, and a cathode C5 of PUT 102 is connected through a resistor 114 to second side 100 of circuit 10. Cathode C5 is also connected to power turn-on means 88. Resistors 106 and 110 are connected to second side 100 of circuit 10. Resistor 112 and capacitor 108 are connected to power turn-off means 91 and to a junction between resistor 96 and capacitor 94 of power supply 86.

Power turn-on means 88 comprises a triac 93, a first anode AN1 of which is connected to second side 100 of circuit 10 and a second anode AN2 of which is connected to snubber means 18 and function timing means 14. A gate G8 of triac 93 is connected through a diode 95 to cathode C5 of PUT 102 of on-delay timing means 90.

Power turn-off means 91 includes a triac 116, a first anode AN1 of which is connected to second side 100 of circuit 10 and a second anode AN2 of which is connected to appliance control/indicating means 20. A gate G7 of triac 116 is connected through a resistor 118 to second side 100 of circuit 10 and through two diodes 120 and 122 to a collector CL1 of a transistor 124. The junction of diodes 120 and 122 is connected through a resistor 126 to power supply means 86 and on-delay timing means 90. An emitter E1 of transistor 124 is connected to second side 100 of circuit 10, and a base B1 is connected to off-delay timing means 92.

Off-delay timing means 92 includes a programmable unijunction transistor (PUT) 128, a cathode C6 of which is connected through a resistor 130 to base B1 of transistor 124. An anode A6 of PUT 128 connects to a junction between two resistors 132 and 134. Resistor 132 is connected to second side 100 of circuit 10, and resistor 134 is connected to normally-closed stationary contact Q12 of function timing means 14. Resistor 134 is also connected to one side of a capacitor 136, the other side of which is connected through a resistor 138 to a gate G6 of PUT 128, and through another resistor 140 to second side 100 of circuit 10.

Snubber means 18 comprises a series combination of a resistor 142 and a capacitor 144 connected between anode AN2 of triac 93 and second side 100 of circuit 10.

AC power supply 11 includes two terminals L1 and L2, wherein L1 is connected to first side 42 of circuit 10 and L2 is connected to second side 100 of the circuit.

Appliance control indicator means 20 includes a power relay 146, a momentary power switch 156, an operation relay coil 158, an operation-indicator 160, a double-pole, single-throw switch 162, and a ready indicator 164.

A movable contact 148 of relay 146 is connected to terminal L1 of AC power supply 11, and a stationary contact 150 of relay 146 is connected to first side 42 of circuit 10. One side of a relay coil 154 is connected to first side 42 of circuit 10, and another side of coil 154 is connected to anode AN2 of triac 116 in power turn-off means 91.

One contact of switch 156 is connected to terminal L1 of AC power supply 11 and another contact is connected to first side 42 of circuit 10.

One side of operation relay coil 158 is connected to first side 42 of circuit 10, and another side of coil 158 is connected to operation indicator 160 and alarm timing means 12. Operation indicator 160 comprises a series combination of a diode 166 and a neon light 168. Diode 166 is connected to first side 42 of circuit 10, and neon light 168 is connected to relay coil 158.

Operation relay coil 158 operates a set of relay contacts 182 which provide power from a power supply 184 to an appliance 186.

A movable contact 170 of switch 162 is connected to function timing means 14 and to anode A2 of triac 93 in delay timing means 16. A stationary contact 172 of switch 162 is connected to movable contact M1 of relay/alarm switching means 28, and another stationary contact 174 of switch 162 is connected to the junction between SCR 68 and solenoid 66 of function timing means 14.

Ready indicator 164 comprises a series combination of a resistor 176, a diode 178, and a neon light 180. One side of resistor 176 is connected to first side 42 of circuit 10, and another side is connected to an anode of diode 178. The cathode of diode 178 is connected to neon light 180, and the other side of neon light 180 is connected to second side 100 of circuit 10. The junction between resistor 176 and diode 178 is connected to these components of alarm timing means 12: neon light 168, operation relay 158, contacts P1-P6, and anode A1 of diode 34.

In operation, power is applied to circuit 10 from AC power supply 11 through terminals L1 and L2. Upon closing of momentary switch 156, power is applied to power relay 146 and to power supply 86. The AC voltage is rectified by diode 98, and filtered by resistor 96 and capacitor 94. The DC voltage thus formed is applied to power turn-off means 91. Triac 116 is biased on through resistor 126 and diode 120. With triac 116 on, the coil 154 of power relay 146 is connected to terminal L2. Contacts 148 and 150 of relay 146 now close, latching on relay 146. Momentary switch 156 may now be opened without loss of power to the circuit.

If nothing else occurs in the switching of circuit 10, off-delay timing means 92 will, after a predetermined period of time, turn transistors 124 on. This lowers the voltage at the junction of diodes 120 and 122, and triac 116 turns off. This action, in turn, removes ground from coil 154 of power relay 146 causing contacts 148 and 150 to open.

When power was initally applied, as described previously, to power supply 86 and power turn-off means 91, it was also supplied to on-delay timing means 90. Capacitor 108 charges up through resistor 106 to a voltage slightly lower than that set by resistors 110 and 112. When this point is reached, PUT 102 turns on causing a voltage to appear across resistor 114. This voltage is sufficient to turn on power turn-on means 88. Due to the placement of capacitor 108 in the gate circuit of PUT 102, the PUT latches up and bias remains available to triac 93 through diode 95. The triac will not turn off unless power is removed from the control via relay 146.

When triac 93 turns on, ground is applied to second timing means 54, switch reset means 52, and switch 162.

Upon switching of switching means 48 so that movable contacts M7-M12 are engaging stationary contacts P7-P12, the following functions occur: The path through contacts M7-M12 and Q7-Q12 is broken. This removes power from off-delay means 92 and prevents triac 116 from being turned off and removing power to the circuit. At the same time, voltage from power supply 50 is applied to timing resistors 56 through contacts M7-M12 and P7-P12 and patch cords PC7-PC12. This voltage applied through resistors 56 and 82 charges capacitor 84. When the voltage across capacitor 84 reaches a level slightly greater than that at the gate of PUT 70, the PUT will conduct. This produces a pulse across resistor 75 which turns on SCR 68. The voltage at the gate of PUT 70 is determined by resistors 80, 76, and variable resistor 72.

When SCR 68 turns on, solenoid 66 is energized. This solenoid is attached to switch latching bar 28' and, when turned on, releases the bar causing switching means 48 to reset, wherein contacts M7-M12 are again engaging contacts Q7-Q12. This action again applies voltage to off-delay timing means 92.

In the embodiment of the invention wherein switching means 28 is mechanically linked to switching means 48, contacts M1-M6 engage contacts Q1-Q6 at the same time contacts M7-M12 engage contacts Q7-Q12. This causes ground to be applied to operation relay 158 through switch 162 and triac 93. Relay 158 operates an appliance for the time interval determined by one or a combination of resistors 56 and patch cords PC7-PC12.

In addition to relay 158, switch 162 applied ground to operation indicator 160 and first timing means 24. This action causes neon light 168 to be illuminated. At the same time, the junction between resistor 176 and diode 178 is grounded. This turns off ready indicator 164. With ground applied to timing means 24, diode 34 converts the AC voltage to DC and charges capacitor 38 through resistor 36.

When switch 28 resets so that contacts M1-M6 are engaging contacts Q1-Q6 ground is removed from relay 158, timing means 24, operation indicator 160, and ready indicator 164. At the same time ground is applied to audible alarm 22. The voltage across capacitor 38 discharges into gate G2 of SCR 46 through resistor 40. This completes the path for audible alarm 22, and it is energized. When the capacitor is discharged, SCR 46 turns off and is held off by resistor 44. This opens the path to audible alarm 22 and turns it off.

If during the above-described timed interval, switch 162 is operated so that contact 170 breaks with contact 172 and engages contact 174, solenoid 66 will be immediately energized thereby resetting relay 158 and removing power from appliance 186.

If switch 162 is operated at any time after the first few seconds of operation of circuit 10, the following will occur: The solenoid will be energized. This prevents switching means 28 from latching up. The path between contacts M1-M6 of switch 28 and contact 170 is broken so that power may not be applied to relay 158 and, therefore, appliance 186. By grounding solenoid 66, the input to power supply 50 is grounded. This effectively removes the voltage from off-delay timing means 92 and insures that triac 116 will remain on and power remains available to the circuit.

If switch 162 is operated during the time interval before on-delay timing means 90 has energized triac 93, solenoid 66 will not operate nor will power supply 50 be grounded. However, as soon as on-delay timing means 90 operates power turn-on means 88, the sequence as described in the previous paragraph will occur.

Switch 162, in one application of the invention comprises a safety shut-off switch connected to a door of a microwave oven. When the door to the oven is open, it may be desired that a blower be operated and the magnetron tube have filament voltage applied. This is accomplished by preventing triac 116 from turning off. The triac is prevented from turning off by preventing off-delay timer 92 from operating. In addition, momentary switch 156 is usually another switch which closes when the door is opened, thus initiating the complete sequence of control events. Diodes 178, 166, 120, 122, 78 and 95 are placed in the circuit to eliminate various feedback paths.

As was mentioned previously, one application of the present invention is in a microwave oven appliance. Switching means 28 and 48, in this application, comprise a push-button switch assembly wherein movable contacts M1-M6 are mechanically linked respectively to movable contacts M7-M12. For example contact M1 moves with contact M7 when one push-button is pushed. Six push-buttons, not shown, then control these pairs of movable contacts: M1 with M7, M2 with M8, M3 with M9, M4 with M10, M5 with M11, and M6 with M12. Each push-button can determine a different length of cooking time for the oven determined by function timing means 14 in conjunction with timing resistors 56. At the end of a timed cooking cycle, buzzer 30 sounds to alert the operator that the oven has stopped cooking.

In a microwave oven, the magnetron tube is the device that actually produces microwaves for cooking. To insure long life of the magnetron, the filament should be energized prior to high voltage being applied through operation relay 158 to the tube. It is the high voltage that causes the magnetron to produce the cooking energy. After a push-button of switching means 28 and 48 has been depressed, on-delay timing means 90 delays the application of high voltage to the magnetron for about 5 seconds to allow the magnetron's filaments to warm up. Off-delay timing means 92 provides power to the magnetron filament for a predetermined period of time after an item is cooked, for example 60 seconds, to allow the operator to remove the item and place another to be cooked in its place. Then, if he presses a push-button switch of switching means 28 and 48 within the 60-second period after the last item finished cooking, the filament remains energized and the magnetron starts cooking immediately.

If the predetermined period of time for the off-delay timing means is exceeded, then the magnetron will not begin cooking as soon as a push-button switch is depressed. Instead, on-delay timing means 90 delays high voltage from reaching the magnetron as explained previously to give the filament of the magnetron time to heat up properly before the high voltage is applied.

Ready indicator lamp 180 glows to indicate that power is supplied to circuit 10 and the oven is ready to be operated. Cooking indicator lamp 168 indicates that the oven is cooking, i.e. the application of high voltage to the magnetron tube.

Because of the potential danger of human exposure to microwaves, an oven can be equipped with a safety interlock switch in the door of the appliance. In this invention switch 162 provides this function. If the door is pulled open, switch 162 immediately removes high voltages power to the magnetron, and the production of microwaves ceases.

What is claimed is:
1. A timed switching circuit for controlling the operation of an appliance comprising in combination:
    a. means connecting said timed switching circuit to an alternating current power supply;
    b. an alarm timer means providing an audible alarm at predetermined time intervals;
    c. a function timer means connected to said alarm timer means for providing an operational sequence at predetermined time intervals;
    d. a power supply means connected between first and second sides of said timed switching circuit;
    e. an on-delay timing means connected to said power supply means for producing a predetermined time delay before power is applied to said appliance from said alternating current power supply;
    f. power-turn on means connected to said on-delay timing means for turning power on from said power supply means;
    g. an off-delay timing means connected to said function timer means producing a time delay after power is disconnected through said power turn-on means;
    h. a power turn-off means connected to said off-delay timing means for maintaining power during said time delay and subsequently turning off power from said power supply means;
    i. snubber means connected to said power turn-on means to prevent same from turning on momentarily at the beginning of a timing cycle; and
    j. an appliance control/indicator means connected to said appliance for controlling a function and indicating a state of operation of same.
2. The combination as recited in claim 1, wherein said alarm timer means includes:
    a. an audible alarm;
    b. a first timing means connected to said audible alarm;
    c. alarm turn-on means connected to said timing means; and
    d. a relay/alarm switching means for switching power to said audible alarm and to said first timing means.
3. The combination as recited in claim 2 wherein said audible alarm comprises an electromechanical buzzer, said alarm turn-on means comprises a silicon-controlled rectifier, said relay/alarm switching means comprises a multi-pole push button switch, and said first timing means comprises:
    a. one side of a first capacitor connected to a first side of said timed switching circuit;
    b. a first resistor connected between another side of said first capacitor and a cathode of a first diode;
    c. a second resistor connected between the junction of said first resistor and said first capacitor and a gate of said silicon-controlled rectifier; and
    d. a third resistor connected between said gate and said first side of said timed switching circuit.
4. The combination as recited in claim 1 wherein said function timer includes:
    a. an electrical switching means;
    b. a low-current power supply connected to said electrical switching means;
    c. a switch reset means for periodically resetting said electrical switching means; and d. a second timing means connected between said electrical switching means and said switch reset means.

5. The combination is recited in claim 4 wherein:
a. said electrical switching means includes a gang of single-pole double-throw switches in combination with a chain of resistors, said resistors capable of being connected via patch cords to said gang of single-pole double-throw switches;
b. said low current power supply comprises a series combination of a fourth resistor, a second diode, and a second capacitor;
c. said switch reset means includes a solenoid connected between an anode of a second silicon-controlled rectifier and a first side of said timed switching circuit, said anode also being connected to said low current power supply, and a cathode of said silicon-controlled rectifier connected to said second timing means; and
d. said second timing means comprises;
   i. a programmable unijunction transistor, a gate of which is connected to a variable resistor, an anode of which is connected through a fifth resistor to a junction between a sixth resistor and a third capacitor, and a cathode of which is connected to a gate of said second silicon-controlled rectifier and also through a seventh resistor to said third capacitor.
   ii. another side of said sixth resistor connected to said electrical switching means;
   iii. a third diode, an anode of which is connected to said low current power supply, and a cathode of which is connected through an eighth resistor to said variable resistor; and
   iv. a ninth resistor connected between said variable resistor and said third capacitor.

6. The combination as recited in claim 1 wherein:
a. said power supply means includes a series combination of a fourth diode, a tenth resistor and a fourth capacitor, an anode of said diode connected to a first side of said circuit and said capacitor connected to said on-delay timing means;
b. said on-delay timing means includes:
   i. a second programmable unijunction transistor, an anode of which is connected through an eleventh resistor to said power supply means, a gate of which is connected through a twelfth resistor and a fifth capacitor to said power supply means, and a cathode of which is connected through a thirteenth resistor to a second side of said timed switching circuit,
   ii. a fourteenth resistor connected between said anode of said second programmable unijunction transistor and said second side of said timed switching circuit, and
   iii. a fifteenth resistor connected between the junction of said twelfth resistor and said fifth capacitor and said second side of said timed switching circuit.
c. said power turn-on means includes;
   a triac, a first anode of which is connected to said second side of said timed switching circuit, a second anode of which is connected to said appliance control/indicating means, and a gate of which is connected through a fifth diode to said on-delay timing means;
d. said off-delay timing means includes:
   i. a third programmable unijunction transistor, an anode of which is connected to a junction of sixteenth and seventeenth resistors, a gate of which is connected through an eighteenth resistor to a junction between a sixth capacitor and a nineteenth resistor, and a cathode of which is connected through a twentieth resistor to said power turn-off means,
   ii. said sixteenth resistor and said sixth capacitor connected to said function timer means, and
   iii. said seventeenth and nineteenth resistors connected to said second side of said timed switching circuit; and
e. said power turn-off means includes;
   i. a triac, a first anode of which is connected to a second side of said timed switching circuit, a second anode of which is connected to said appliance control/indicator means, and a gate of which is connected to a cathode of a sixth diode and a twenty-first resistor,
   ii. said twenty-first resistor connected to said second side of said timed switching circuit,
   iii. an anode of said sixth diode connected through a twenty-second resistor to said power supply means, and
   iv. a transistor, a collector of which is connected through a seventh diode to said twenty-second resistor, an emitter of which is connected to said second side of said timer switching circuit, and a base of which is connected to said twentieth resistor.

7. The combination as recited in claim 1 wherein said snubber means comprises a series combination of a twenty-third resistor and a seventh capacitor connected between said power turn-on means and to a second side of said timed switching circuit.

8. The combination as recited in claim 1 wherein said appliance control/indicator means includes:
a. a power switch connected to said alternating current power supply, for switching power to an appliance;
b. a power relay connected to said alternating current power supply for activating said power switch;
c. a ready indicator connected to said power switch for visually indicating that power is applied to said timed switching circuit;
d. an operation relay connected to said alarm timer means;
e. an operation indicator for visually indicating power being applied to said function timer means; and
f. a safety switch connected between said delay timer means and said function timer means for shutting off power to said function timer means.

* * * * *

UNITED STATES PATENT AND TRADEMARK OFFICE
CERTIFICATE OF CORRECTION

PATENT NO. : 3988727
DATED : October 26, 1976
INVENTOR(S) : Charles E. Scott

It is certified that error appears in the above-identified patent and that said Letters Patent are hereby corrected as shown below:

Col. 2, line 2 delete "comprises" and insert ---comprised---.

Col. 7, line 13, after "another" insert ---door---.

Col. 8, line 2, delete "voltages" and insert ---voltage---.

Signed and Sealed this

Twenty-ninth Day of March 1977

[SEAL]

Attest:

RUTH C. MASON
*Attesting Officer*

C. MARSHALL DANN
*Commissioner of Patents and Trademarks*